United States Patent
Fontana et al.

(10) Patent No.: US 9,428,380 B2
(45) Date of Patent: Aug. 30, 2016

(54) SHIELDED ENCAPSULATING STRUCTURE AND MANUFACTURING METHOD THEREOF

(71) Applicant: STMicroelectronics S.r.l., Agrate Brianza (IT)

(72) Inventors: Fulvio Vittorio Fontana, Monza (IT); Giovanni Graziosi, Vimercate (IT); Alex Gritti, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/686,540

(22) Filed: Apr. 14, 2015

(65) Prior Publication Data

US 2015/0217993 A1   Aug. 6, 2015

Related U.S. Application Data

(62) Division of application No. 13/659,753, filed on Oct. 24, 2012, now Pat. No. 9,060,227.

(30) Foreign Application Priority Data

Oct. 27, 2011 (IT) .............................. TO2011A0980

(51) Int. Cl.
*H01L 23/552* (2006.01)
*B81B 7/00* (2006.01)
(Continued)

(52) U.S. Cl.
CPC ............ *B81B 7/0064* (2013.01); *H04R 19/04* (2013.01); *H04R 31/006* (2013.01); *H05K 9/0009* (2013.01); *B81B 2201/0257* (2013.01);
(Continued)

(58) Field of Classification Search
CPC .................. B81B 2201/0257; B81B 7/0064; H04R 19/005; H04R 19/04; H04R 1/021; H04R 1/04; H04R 2201/003; H04R 2201/029; H04R 31/006; H05K 9/0009
USPC ................ 257/659, 666, 710, 704, 416, 77; 438/710, 50, 110, 106; 381/355, 361, 381/174
See application file for complete search history.

(56) References Cited

U.S. PATENT DOCUMENTS

| 4,442,966 A | 4/1984 | Jourdain et al. |
| 7,923,904 B2 * | 4/2011 | Takeuchi ............. H01L 23/562 310/340 |

(Continued)

FOREIGN PATENT DOCUMENTS

EP    2 373 059 A2    10/2011

*Primary Examiner* — Mohammed Shamsuzzaman
(74) *Attorney, Agent, or Firm* — Seed Intellectual Property Law Group PLLC

(57) ABSTRACT

One or more embodiments are directed to encapsulating structure comprising: a substrate having a first surface and housing at least one conductive pad, which extends facing the first surface and is configured for being electrically coupled to a conduction terminal at a reference voltage; a cover member, set at a distance from and facing the first surface of the substrate; and housing walls, which extend between the substrate and the cover member. The substrate, the cover member, and the housing walls define a cavity, which is internal to the encapsulating structure and houses the conductive pad. Moreover present inside the cavity is at least one electrically conductive structure, which extends between, and in electrical contact with, the cover member and the conductive pad for connecting the cover member electrically to the conduction terminal.

25 Claims, 9 Drawing Sheets

(51) Int. Cl.
  *H04R 19/04*  (2006.01)
  *H04R 31/00*  (2006.01)
  *H05K 9/00*   (2006.01)
  *H04R 1/02*       (2006.01)
  *H04R 1/04*       (2006.01)
  *H04R 19/00*      (2006.01)

(52) U.S. Cl.
  CPC .............. *H04R1/021* (2013.01); *H04R 1/04* (2013.01); *H04R 19/005* (2013.01); *H04R 2201/003* (2013.01); *H04R 2201/029* (2013.01)

(56) References Cited

U.S. PATENT DOCUMENTS

| | | | | |
|---|---|---|---|---|
| 8,742,569 | B2* | 6/2014 | Lo ............................ | B81B 7/007 257/710 |
| 8,759,149 | B2* | 6/2014 | Shaw ................... | B81B 7/0064 438/106 |
| 2004/0046245 | A1 | 3/2004 | Minervini | |
| 2007/0201715 | A1 | 8/2007 | Minervini | |
| 2007/0205499 | A1 | 9/2007 | Wang et al. | |
| 2008/0083960 | A1 | 4/2008 | Chen et al. | |
| 2008/0217709 | A1* | 9/2008 | Minervini ............. | B81B 7/0061 257/416 |
| 2010/0183181 | A1* | 7/2010 | Wang ................... | H04R 19/005 381/361 |
| 2010/0195864 | A1 | 8/2010 | Lutz et al. | |
| 2010/0230766 | A1* | 9/2010 | Elian ..................... | G01L 19/141 257/414 |
| 2010/0246877 | A1 | 9/2010 | Wang et al. | |
| 2010/0303271 | A1 | 12/2010 | Wang | |
| 2011/0293126 | A1* | 12/2011 | Maekawa ........... | H04R 19/005 381/355 |
| 2011/0293128 | A1* | 12/2011 | Kuratani ............... | B81B 7/0064 381/361 |
| 2012/0319256 | A1* | 12/2012 | Lo ......................... | B81B 7/0061 257/666 |
| 2013/0026632 | A1* | 1/2013 | Kikuchi ................ | H01L 21/6835 257/753 |
| 2014/0045290 | A1* | 2/2014 | Horimoto ............ | H04R 19/005 438/51 |

* cited by examiner

SHIELDED ENCAPSULATING STRUCTURE AND MANUFACTURING METHOD THEREOF

BACKGROUND

1. Technical Field

The present disclosure relates to a shielded encapsulating structure (or package) and to a manufacturing method thereof, and in particular to an encapsulating structure for a MEMS microphone.

2. Description of the Related Art

The package of microelectromechanical systems (MEMS), such as, for example, microphones and pressure sensors, provides an electrical shielding between the region of space inside the package itself and the external environment in which the package is set. Said shielding has the function of eliminating, or at least reducing, any possible drifts in the signal of the sensor caused by interference due to electrostatic charges, for example generated by magnetic fields external to the package. Basically, said package operates according to the known principle of the Faraday cage.

In addition, the package also performs a function of mechanical protection of the sensor, albeit providing, if necessary, a certain degree of accessibility to the sensor from outside.

The electrical shielding can be obtained with different types of package.

According to an embodiment of a known type, a substrate faces an internal cavity of the package, and is insulated at the top by means of a planar cap. The internal cavity houses one or more devices, formed on the substrate. In this case, the devices housed in the internal cavity of the package are insulated from the environment external to the package by means of: the substrate; side walls, which extend starting from the substrate in a direction orthogonal to the plane in which the substrate itself lies; and the cap, coupled to the side walls in such a way as to face the substrate and the internal cavity of the package. The internal cavity thus formed is insulated from the environment external to the package. The substrate includes a ground plane, generally made of metal, for example copper. The substrate can moreover be coupled to an integrated-circuit board. Said coupling is obtained, for example, according to the standard technology of manufacturing of a substrate referred to as "ball-grid array" (BGA). In this case, conductive bumps are formed in an area corresponding to the surface of the substrate and are connected to the metal layer by means of conductive vias. Other types of substrate and/or coupling can be used. For example, as an alternative to the use of conductive bumps, it is possible to use conductive pads (or leads) coupled to one another by welding paste. Also in this case, the conductive pads are formed in an area corresponding to the surface of the substrate and connected to the metal layer by means of conductive vias.

The cap comprises a metal layer, having the function of electrical shielding between the region of space external to the package and the internal space.

The side walls are glued on the substrate using non-conductive glues or insulating adhesive tape.

To complete formation of a Faraday cage, the metal layer of the cap is electrically connected to the ground plane of the substrate by means of conductive through vias (for example, filled with resin with conductive filler material), formed on the inside of the side walls. There is thus formed a conductive path between the metal of the cap and the ground plane through the side walls, thus obtaining a Faraday cage.

FIG. 1 shows a package of the type described previously, comprising: an integrated-circuit board 1; a substrate 2, coupled to the integrated-circuit board 1 by means of a ball-grid array 4 or by means of conductive pads coupled to the integrated-circuit board 1 with welding paste; side walls 6, coupled to the substrate 2 by means of a non-conductive adhesive layer 8; and a cap 10, coupled to the side walls 6 by means of a further non-conductive adhesive layer 12. The cap 10, the side walls 6, and the substrate 2 define a cavity 14 internal to the package. In addition, the cap 10 comprises, in an area corresponding to the side directly facing the cavity 14, a metal layer 16. Formed on the inside of the side walls 6 are conductive through vias 18, for example filled with resin with conductive filler material, which are adapted to connect the metal layer 16 with a ground plane GND (illustrated schematically), via the ball-grid array 4. The conductive through vias 18 connect the ground plane GND to the metal layer 16. Generic devices and/or sensors 19 are housed in the cavity 14.

The embodiment of FIG. 1 has, however, a relatively high manufacturing cost, due to the need to form the through vias. In addition, the presence of the through vias themselves within the side walls 6 imposes a constraint on the minimum dimensions of the side walls 6, which must have a thickness sufficient to enable formation of the through vias 18, at the same time guaranteeing structural solidity of the package. For these reasons, moreover, the through vias 18 are formed at a certain distance from one another, leaving portions of the side walls 6 not electrically shielded. The Faraday cage is consequently not complete.

Further embodiments of a known type (not shown in the figure) comprise a package in which the substrate is coupled to a cap that has a recess. Said recess forms, when the cap is coupled to the substrate, the internal cavity of the package. Side walls 6 of the type shown in FIG. 1 are consequently not necessary in so far as the cap is directly coupled to the substrate. The cap comprises a metal layer formed on the inside of the recess (on the bottom and on the side walls of the recess) and in an area corresponding to the regions of coupling with the substrate. When the cap is coupled to the substrate, there is no need to form through vias of the type described with reference to FIG. 1 in so far as the walls that define the internal cavity of the package laterally are already metallized. The electrical contact between the cap and the ground plane occurs by means of the metal formed in an area corresponding to the regions that are coupled to the substrate. The substrate has, for this purpose, conductive pads for coupling with the metal of the cap. The Faraday cage that is thus formed is, consequently, complete.

This further embodiment presents, however, the disadvantage of requiring a machined cap (comprising a recess), which has a cost higher than the cost of a planar cap (for example, of the type shown in FIG. 1). In particular, the cost is typically highest in the case of packages for hermetically sealed pressure sensors, which require caps with a particular shielding of the measurement vias. In addition, due to manufacturing reasons, the depth of the recess is limited, and thus the maximum height (measured along an axis orthogonal to the plane of lie of the substrate) of the internal cavity of the package obtained is consequently limited. This embodiment is consequently suitable for MEMS sensors that require a relatively reduced height of the cavity, for example MEMS microphones in which the volume underlying the membrane of the microphone is smaller than the volume surrounding the sensor itself.

BRIEF SUMMARY

One or more embodiments of the present disclosure are directed to a shielded encapsulating structure and a manufacturing method thereof that will be able to overcome the drawbacks of the known art.

According to the present disclosure a shielded encapsulating structure and a manufacturing method thereof are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 2A:
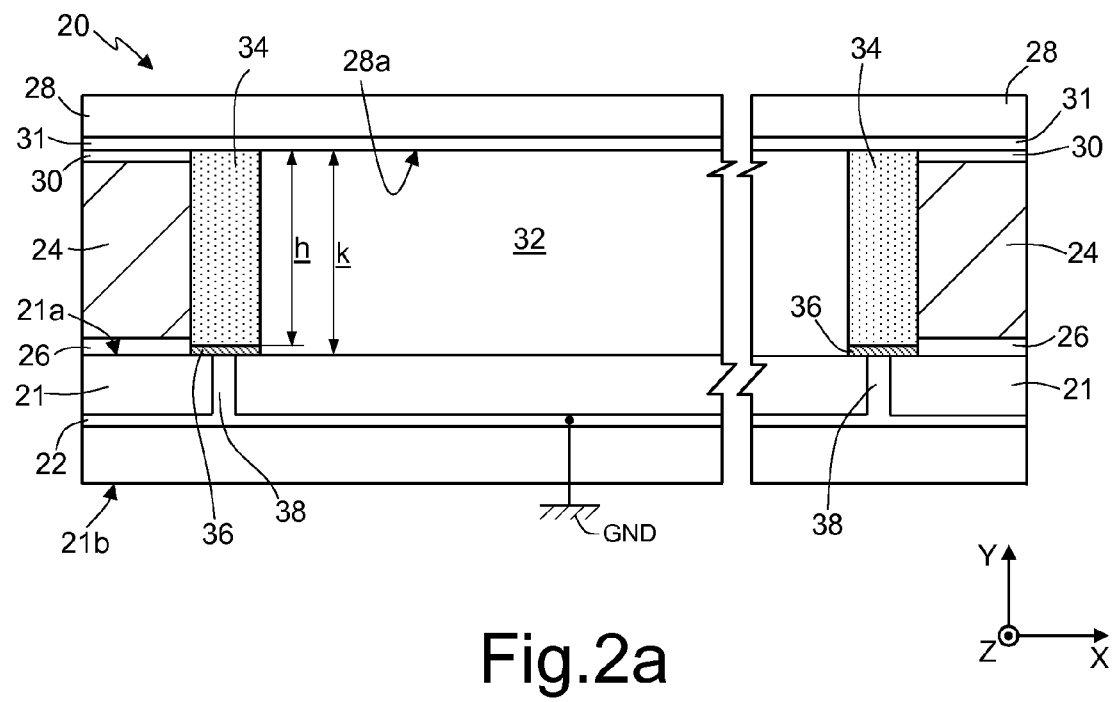
FIGS. 2a and 2b show, respectively in cross section and in top plan view, an encapsulating structure according to an embodiment of the present disclosure.
Figure 2B:
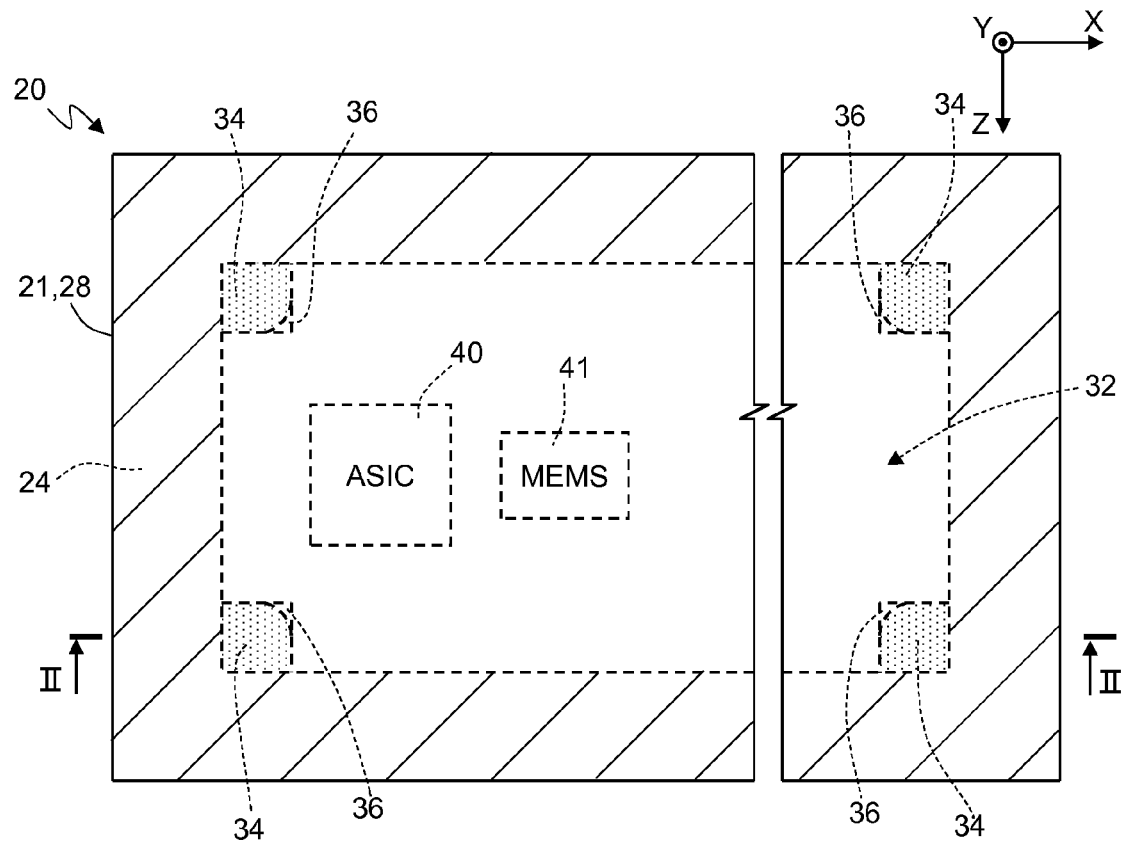

FIG. 2a shows, in cross-sectional view along a line of section II-II of FIG. 2b, an encapsulating structure, or package 20 according to one embodiment of the present disclosure. FIG. 2b shows the package 20 of FIG. 2a in top plan view.

The package 20 comprises a substrate 21 (lying in a plane XZ), comprising one or more metal layers 22 (only one of which is shown by way of example in FIG. 2a), which extend on the inside of the substrate 21 or in areas corresponding to surface regions of the substrate 21.

One of said metal layers 22 extends throughout the extension of the substrate 21, and is connected to a ground plane GND of the package 20. According to one embodiment, in order to form a complete shield, the metal layer 22 extends throughout the extension of the substrate 21. Other embodiments, in which the metal layer 22 extends only partially in the substrate 21 are, however, possible.

The substrate 21 moreover houses one or more electrical and/or electronic and/or MEMS devices and/or components, such as ASIC 40 and MEMS 41 as illustrated in FIG. 2b but not illustrated in FIG. 2a to more clearly show further aspects of the package 20. The manufacturing process of said electrical and/or electronic and/or MEMS devices and/or components are known. In particular, the substrate 21 houses an electronic or microelectromechanical device, operation of which can be adversely affected by the presence of magnetic fields or electrostatic charges coming from the environment external to the package 20. In particular, said device may be a MEMS microphone.

The substrate 21 is, for example, made of plastic or ceramic material, or FR-4 (fibreglass), or a flexible material adapted to form a substrate of a flexible-printed-circuit (FPC) type. The ground plane GND is, for example, the ground plane of a printed circuit board (PCB) to which the substrate 21 is connected via metal bumps or conductive paste coupled to respective conductive pads, in a way similar to what has already been shown and described with reference to FIG. 1. Other materials that can be used for the substrate 21, and, in general, any structure adapted to carry electrical elements (electronic devices, components, etc.) can be used to form the substrate 21.

The package 20 comprises an internal cavity 32, adapted to house the electrical and/or electronic and/or MEMS devices and/or components. The internal cavity 32 is delimited at the bottom by the substrate 21 and laterally (along planes XY orthogonal to the plane XZ) by walls 24.

The substrate 21 has a surface 21a and a surface 21b, opposite to one another. The side walls 24 rest on the surface 21a of the substrate 21 (with a coupling interface) and extend vertically in a direction Y orthogonal to the plane XZ, proceeding away from the substrate 21 along the axis Y. As may be noted from FIG. 2b, according to one embodiment, the substrate 21 has a quadrangular shape (for example, in FIG. 2b it is shown as having a rectangular shape), and the walls 24 extend throughout the length of the four sides of the substrate 21, surrounding the internal cavity 32 laterally.

The side walls 24 are, for example, made of BT (bismaldehyde-trizaine) resin reinforced with fibreglass, plastic, or metals such as aluminium, copper, etc.

The side walls 24 are coupled to the surface 21a of the substrate 21 in such a way as to be fixed with respect to the substrate 21. The coupling interface between the side walls 24 and the substrate 21 comprises a first coupling region 26 of non-conductive glue or non-conductive biadhesive tape.

The side walls 24 are moreover coupled to a cap 28, which extends in a plane substantially parallel to the plane XZ, at a distance from substrate 21. The cap 28 comprises, according to one embodiment of the present disclosure, a conductive layer 31, made, for example, of metal such as aluminium or copper or the like, which extends in an area corresponding to a side 28a of the cap 28. The remaining portion of the cap 28 may, for example, be made of plastic material, or fibreglass, or some other material chosen according to the needs. The side 28a of the cap 28 is the side that, at the end of the steps of manufacture of the package 20, directly faces the surface 21a of the substrate 21.

Figure 14:
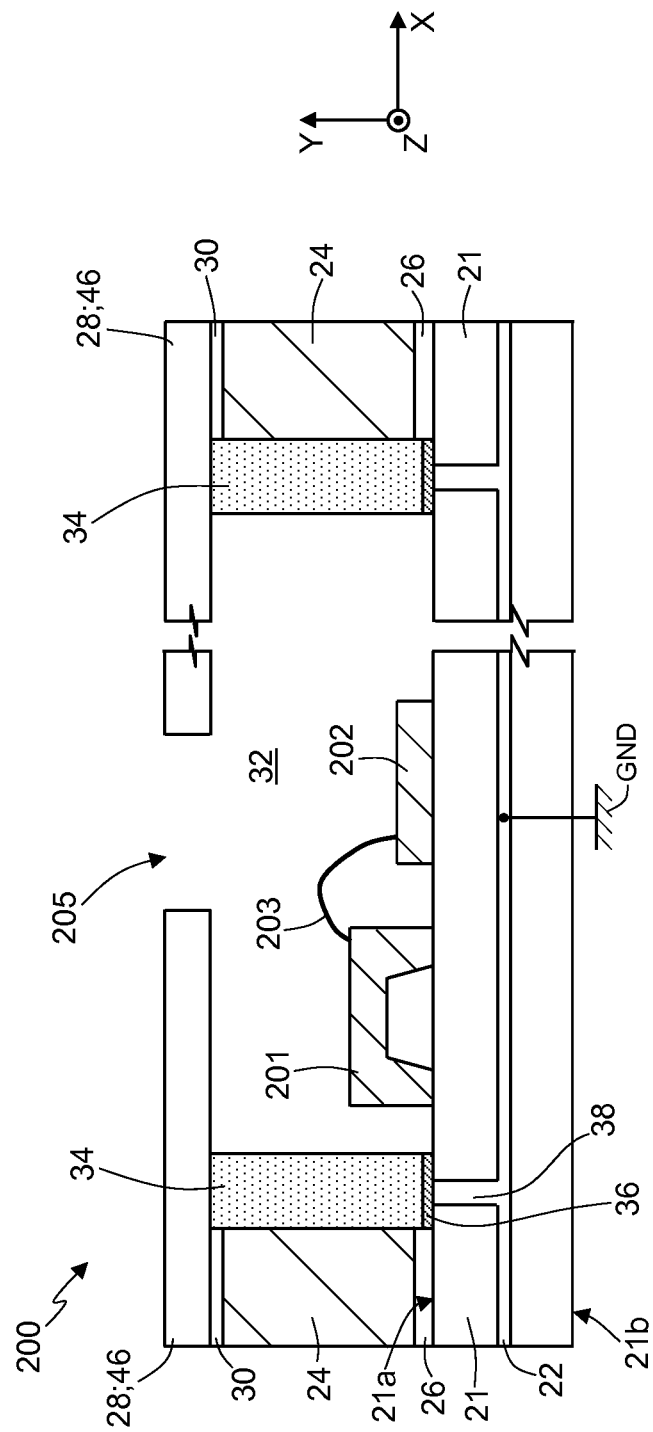
FIG. 14 shows an encapsulating structure formed according to one of the embodiments of the present disclosure housing a MEMS microphone.

The cap 28 can comprise (in a way not shown in the figure), one or more through vias, which are adapted to ensure accessibility from the outside of the package towards the internal cavity 32 (see, for example, FIG. 14 for an embodiment provided by way of non-limiting example of use of a package comprising a perforated cap).

The side walls 24 are coupled to the side 28a of the cap 28 by means of a second coupling region 30, for example made of non-conductive glue or non-conductive biadhesive tape, or conductive glue or biadhesive conductive tape.

In this way, the side walls 24 extend between the substrate 21 (in particular, the surface 21a of the substrate 21) and the cap 28 (in particular, the side 28a of the cap 28), and maintain the cap 28 in position above the substrate 21. There is thus formed the internal cavity 32, delimited by the substrate 21, by the side walls 24, and by the cap 28. The side 28a of the cap 28 and the surface 21a of the substrate 21 directly face the internal cavity 32.

The internal cavity 32 has a height k, measured in the direction of the axis Y between the surface 21a of the substrate 21 and the side 28a of the cap 28, given by the sum of the thickness (measured in the direction Y) of the first coupling region 26, of the side walls 24, and of the second coupling region 30.

As may be seen in FIG. 2b, the internal cavity 32 is adapted to house one or more electronic circuits (for example electronic circuits such as microcontrollers or ASICs) and/or electromechanical circuits (for example, microelectromechanical sensors such as microphones produced using MEMS technology), and/or chips, housing in turn electronic circuits, mounted on the substrate 21 in a region corresponding to the surface 21a. The electronic circuits, and/or the electromechanical circuits, and/or the chips can be electrically connected together by means of conductive wires, obtained with known wire-bonding techniques. The internal cavity 32 can, in general, house any type of electrical, electronic, mechanical, microelectromechanical component and/or device, or components and/or devices of some other type.

In order to guarantee an electrical connection between the ground plane GND and the cap 28 (in particular, the conductive layer 31 of the cap 28), the package 20 further comprises conductive columnar elements 34, which extend between the substrate 21 and the cap 28, on the inside of the cavity 32, to connect the substrate 21 electrically with the cap 28. For this purpose, the substrate 21 further comprises a plurality of conductive pads 36, formed in an area corresponding to the surface 21a and adapted to define a conductive region for the electrical contact with respective conductive columnar elements 34. In turn, the conductive pads 36 are in electrical connection with the metal layer 22, and hence with the ground plane GND, by means of conductive vias 38. In this way, the cap 28 is in electrical connection with the ground plane GND via the conductive columnar elements 34.

The conductive columnar elements 34 have a height h (measured in the direction of the axis Y) given by the sum of the thickness (once again measured in the direction Y) of the first coupling region 26, of the side walls 24, and of the second coupling region 30, minus the possible thickness of the conductive pad 36 above the surface 21a of the substrate 21, in the case where the conductive pad 36 projects beyond the surface 21a.

The conductive columnar elements 34 may be or include electrically conductive glue, for example a glue (or resin) with epoxy base comprising silver or some other electrically conductive material.

The type of glue to be used is chosen case by case, according to the needs. For example, to form conductive columnar elements 34 with a high ratio between the base area and the height (high aspect ratio), in particular having a height h comprised between 0.3 mm and 0.8 mm, it may be desired to use a glue with high viscosity, for example with a value of viscosity of 30,000 centipoise (cps) (30,000 millipascal-second (mPa·s)) or more.

Instead, to form conductive columnar elements 34 having a low value of aspect ratio, in particular having a height h lower than 0.3 mm, it is possible to use a glue with a viscosity lower than the previous case.

In any case, the viscosity of the glue is such as to enable formation of conductive columnar elements 34, the base area of which is entirely contained within the respective pad 36. Each pad 36 has a quadrangular shape, typically square, with base side may be between 0.3 mm and 1 mm. It is evident that, if necessary, the values indicated can vary; for example, the pads 36 may have a base side greater than 1 mm and a different shape from the square one.

According to one embodiment of the present disclosure, the conductive columnar elements 34 are formed in direct contact with the side walls 24. However, according to other embodiments (not shown), the conductive columnar elements 34 can be formed at a distance from the side walls 24.

As may be noted from FIG. 2b, the substrate 21 and the cap 28 have a substantially quadrangular shape (but any other geometrical shape is possible). The internal cavity 32 houses, for example, an ASIC 40 and a MEMS sensor 41 (for example, a microphone). The side walls 24 extend in a peripheral area of the substrate 21, surrounding and defining the internal cavity 32.

FIG. 2b shows four conductive pads 36. However, the number of conductive pads can be different from four (greater or smaller). Also the number of conductive columnar elements 34 may be different from four (greater or smaller).

Figure 3:
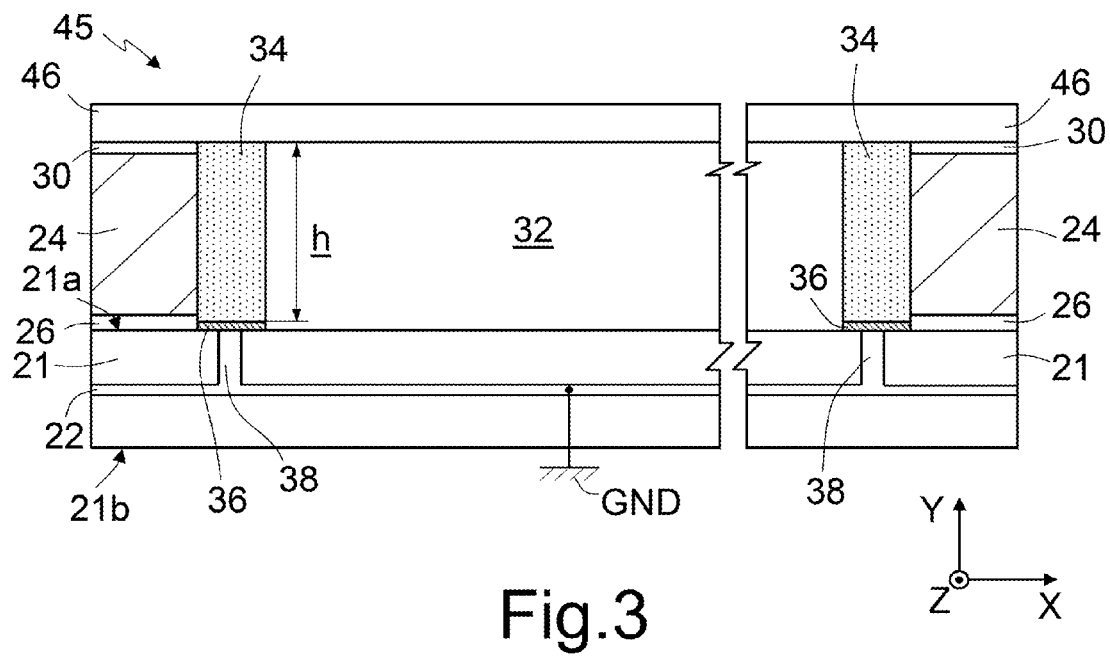
FIG. 3 shows, in cross section, an encapsulating structure according to a further embodiment of the present disclosure.

FIG. 3 shows a further embodiment of the present disclosure. FIG. 3 shows, in cross-sectional view, a package 45 similar to the package 20 of FIGS. 2a and 2b. The package 45 differs from the package 20 in that the package 45 comprises a cap 46 similar to the cap 28 of the package 20, but without the conductive layer 31. Instead, the cap 46 is itself made of conductive material, for example metal, such as aluminium, copper, stainless steel, or the like.

Other elements of the package 45 that are in common with the package 20 of FIGS. 2a and 2b are designated by the same reference numbers and are not described any further here, for reasons of brevity.

Figure 4A:
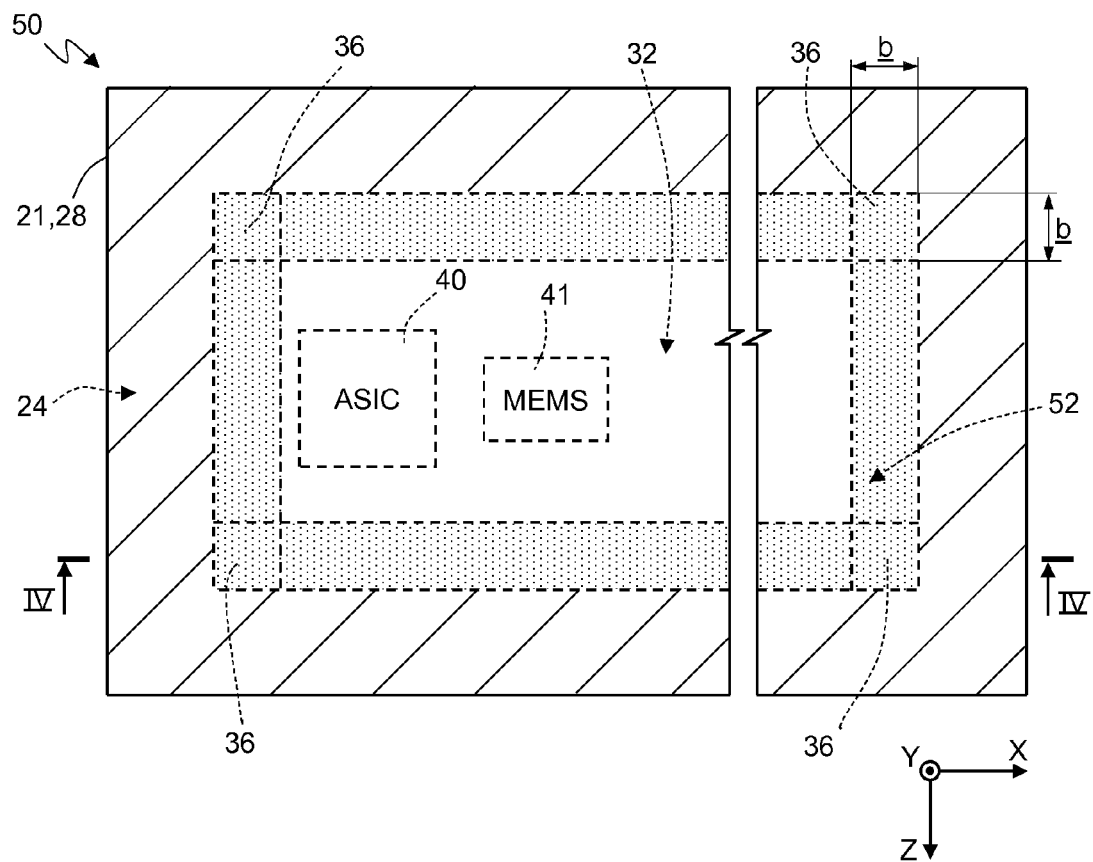
FIGS. 4a and 4b show in top plan view and in cross section, respectively, an encapsulating structure according to a further embodiment of the present disclosure.

FIG. 4a shows, in top plan view, a package 50 according to a further embodiment of the present disclosure.

Figure 4B:
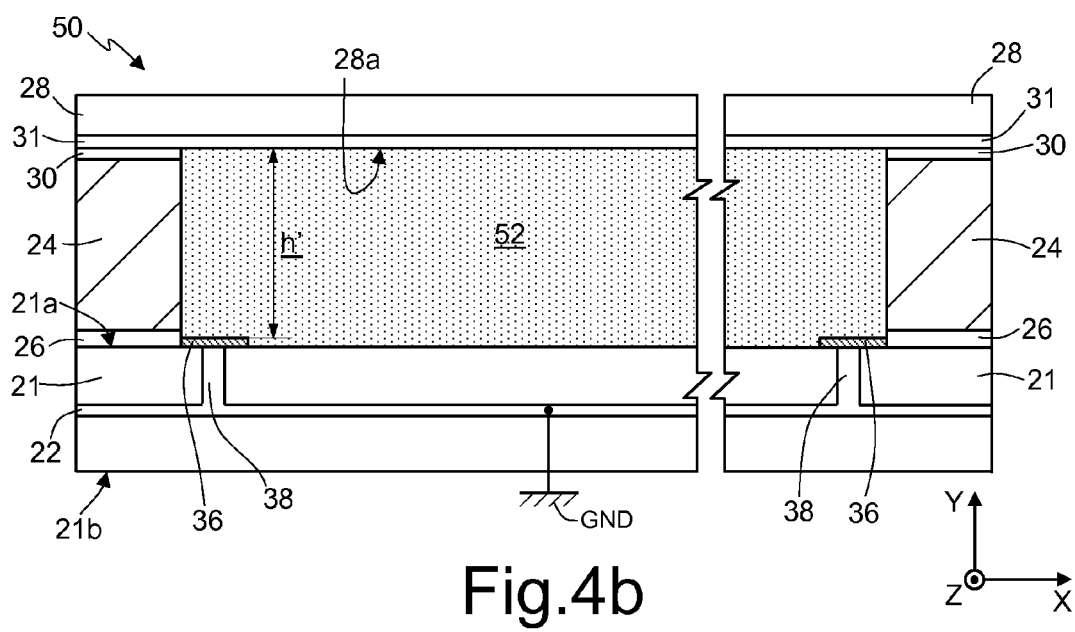

FIG. 4b shows a cross-sectional view of the package 50 along the line of section IV-IV of FIG. 4a.

Elements of the package 20 of FIGS. 2a and 2b that are in common with those of the package 50 of FIGS. 4a and 4b are identified by the same reference numbers and are not described any further, for reasons of brevity.

The package 50 differs from the package 20 in that it does not comprise the plurality of conductive columnar elements 34. Instead, the package 50 comprises a conductive structure 52, which extends in a continuous way along the side walls 24, on the inside of the cavity 32. The conductive structure 52 extends in contact with the side walls 24, between the substrate 21 and the cap 28. The conductive structure 52 is in direct electrical contact with the conductive pads 36 and, via the latter and the vias 38, with the ground plane GND.

With joint reference to FIGS. 4a and 4b, the conductive structure 52 has a height h' (measured in the direction of the axis Y) equal to the height h of the conductive columnar elements 34, and in any case such as to form an electrical contact between the cap 28 and the conductive pads 36. The conductive structure 52 substantially has a height h' given by the sum of the thickness, measured in the direction Y, of the first coupling region 26, of the side walls 24, and of the second coupling region 30, minus the possible thickness (above the surface 21a of the substrate 21) of the conductive pad 36 in the regions in which the latter are present.

The conductive structure 52 extends moreover starting from the side walls 24 towards the inside of the cavity 32, parallel to the plane XY (on top of and in contact with the surface 21a). The extension of the conductive structure 52 from the side walls 24 towards the inside of the cavity 32 defines the thickness b of the conductive structure. According to one embodiment, the thickness b is such that, in an area corresponding to the conductive pads 36, the conductive structure 52 remains confined within the base area of the conductive pads 36. The thickness b is moreover substantially uniform throughout the extension of the conductive structure 52. For example, b is may be between h/2 and h.

It is evident that, according to alternative embodiments, or on account of imprecision during dispensing of the glue, the thickness b may not be uniform throughout the extension of the conductive structure 52, and/or exceed the sides that define the base area of the conductive pads 36. However, in this case, there is a corresponding reduction of the usable volume of the internal cavity 32.

The conductive structure 52 is a layer of electrically conductive glue, in particular of the same type as the one described with reference to FIGS. 2a, 2b for the package 20. The same considerations made above apply here as regards the choice of the viscosity of the glue, which depends upon the specific application and upon the height h' of the conductive structure 52 that is to be obtained.

The embodiment of FIGS. 4a, 4b presents the advantage of enabling formation of a complete Faraday cage in so far as the internal cavity 32 is completely shielded with respect to the environment external to the package 50. However, the volume of the internal cavity 32 is reduced with respect to the embodiment of FIGS. 2a, 2b.

According to a further embodiment (not shown in the figure), the package 50 comprises a cap 46 of the type described with reference to FIG. 3.

Figure 5A:
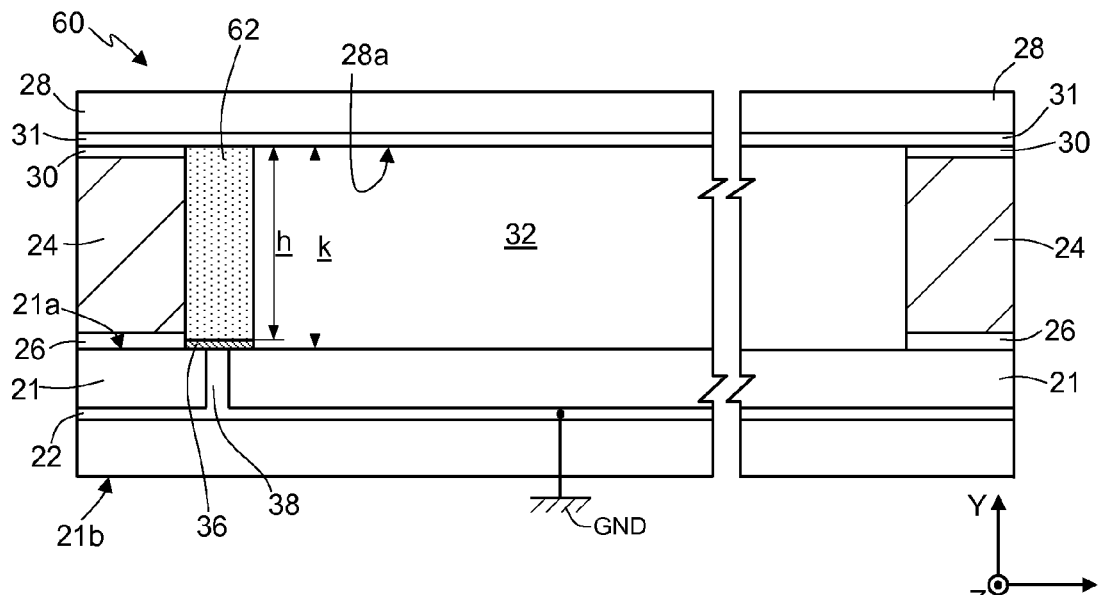
FIGS. 5a and 5b show in top plan view and in cross section, respectively, an encapsulating structure according to a further embodiment of the present disclosure.
Figure 5B:
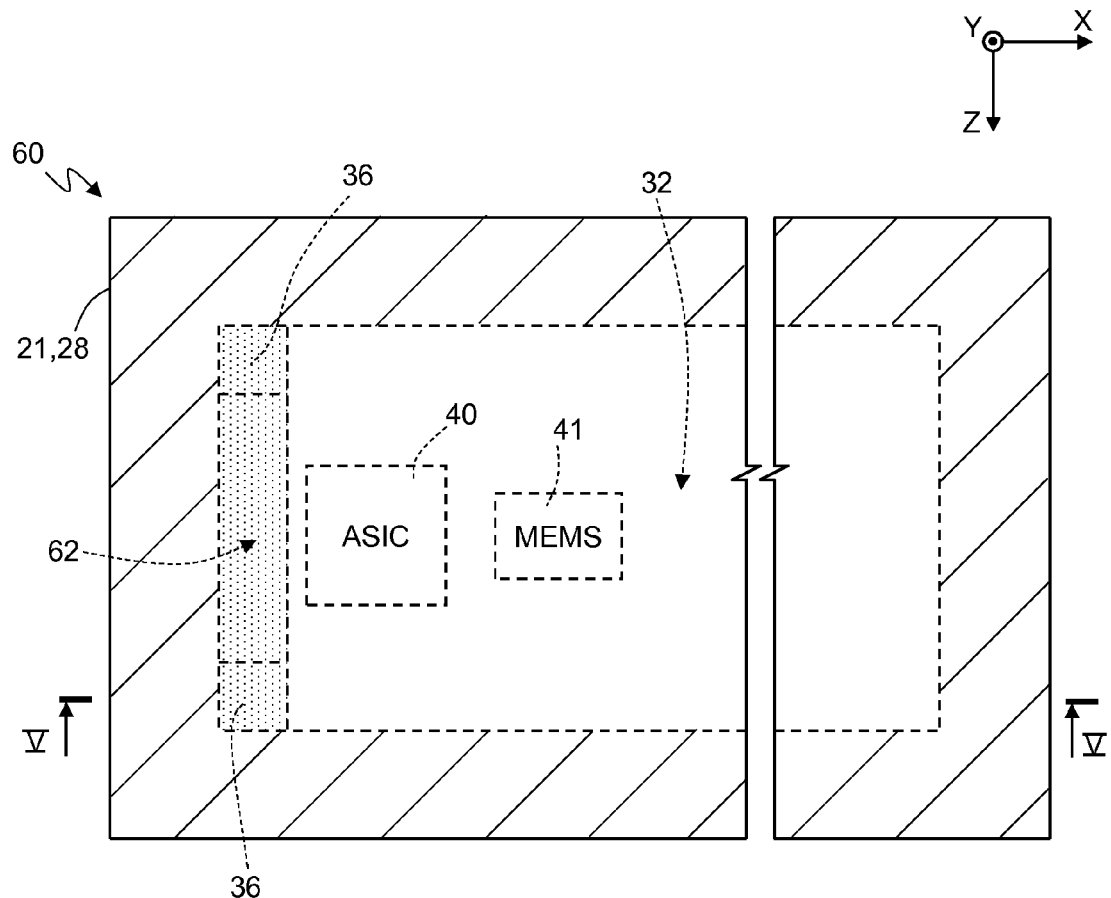

FIGS. 5a and 5b show a package 60 in lateral section and in top plan view, respectively, of a further embodiment of the present disclosure.

FIG. 5a is a view along the line of section V-V of FIG. 5b. Elements of the package 60 that are common to the package 20 of FIGS. 2a, 2b and/or to the package 50 of FIGS. 4a, 4b are designated by the same reference numbers and are not described any further.

According to the embodiment of the package 60, the electrical contact between the cap (which may be indifferently of the type shown in FIG. 2a or of the type shown in FIG. 3) and the ground plane GND is obtained by means of a conductive structure 62 that extends in an area corresponding to a portion of the side walls 24, on the inside of the cavity 32, leaving the remaining portion of the side walls 24 exposed. Unlike what is shown in FIGS. 4a and 4b, the conductive structure 62 does not cover completely the side walls 24 within the cavity 32, but coats them only partially. The advantage, in this case, lies in the possibility of obtaining an internal cavity 32 of oversized volume with respect to the embodiment of FIG. 4a, at the expense of a non-complete electrical shielding.

The conductive structure 62 may be or include conductive glue of the same type as the one described with reference to the embodiments of FIGS. 2a, 2b and 4a, 4b.

Figure 6A:
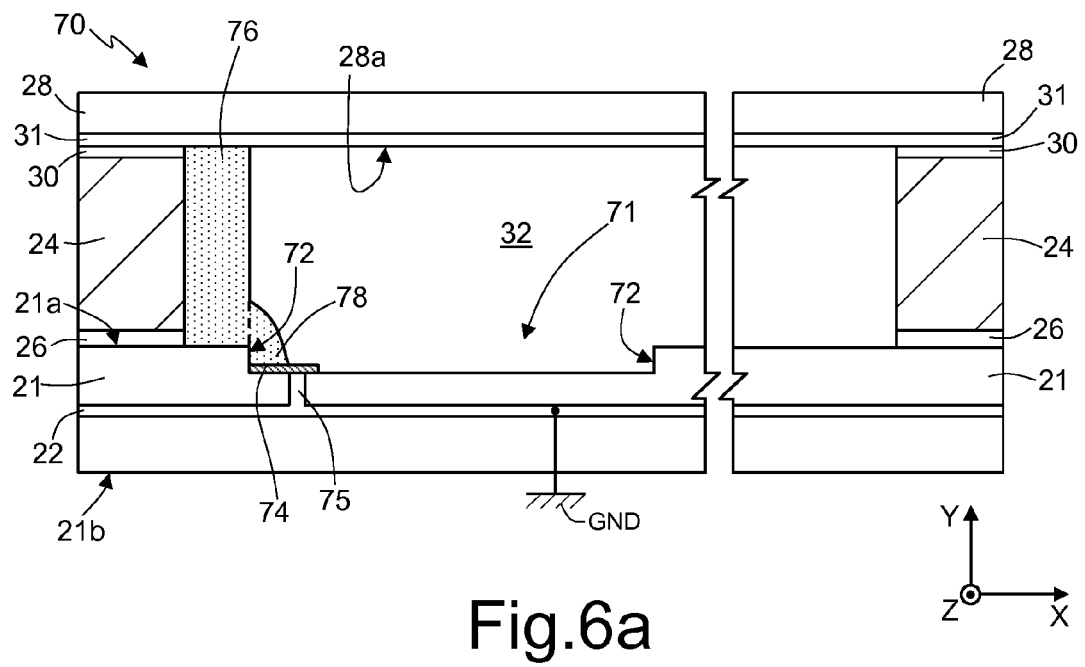
FIGS. 6a and 6b show in cross section and in top plan view, respectively, an encapsulating structure according to a further embodiment of the present disclosure.
Figure 6B:
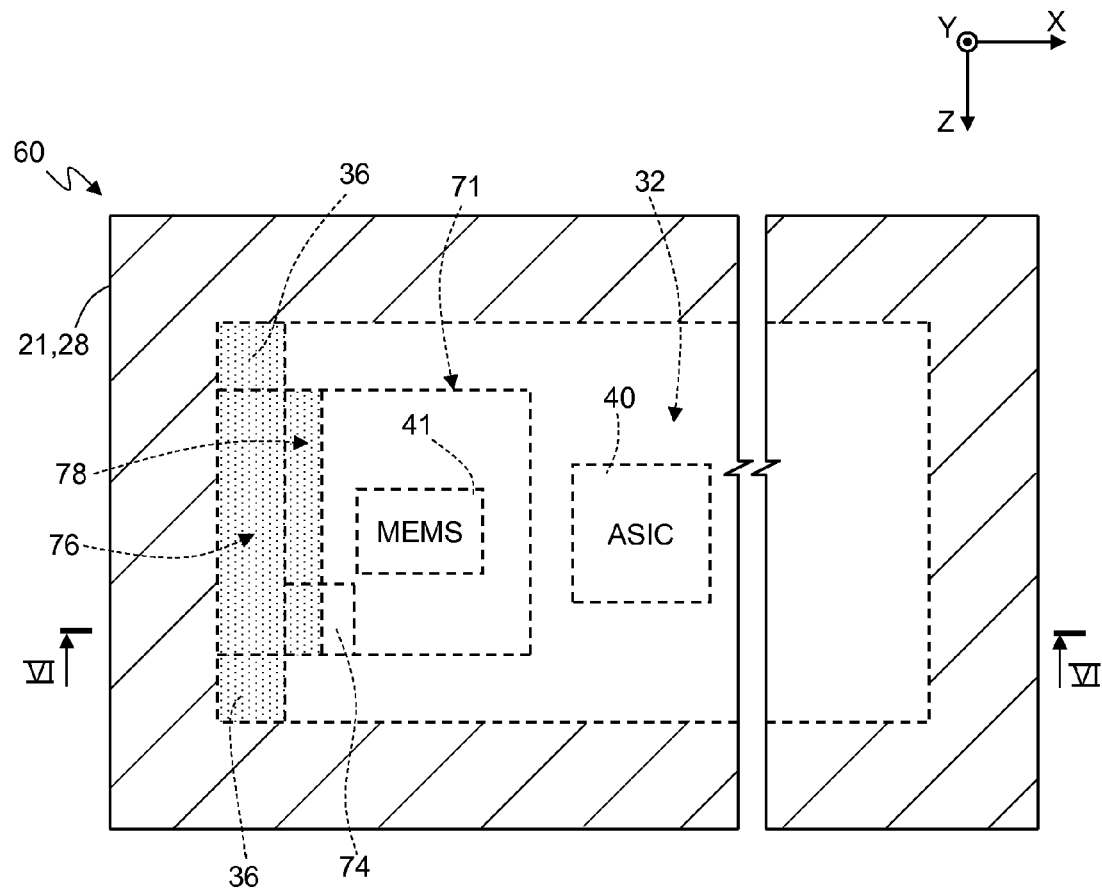

FIGS. 6a and 6b show a further embodiment of a package 70, in which the surface of the substrate 21 has one or more deep regions (or recesses) 71, which extend to a height, measured along the axis Y, may be between the height at which the surface 21a extends and the height at which the surface 21b extends. A substrate that has a deep region 71 can be used for housing chips of electronic circuits and chips of MEMS devices set on top of one another, each at a respective height.

FIG. 6a is a cross-sectional view of FIG. 6b, along the line of section VI-VI of FIG. 6b. FIGS. 6a and 6b show a single deep region 71. The deep region 71 has a substantially quadrangular shape (but any other shape is possible), and is laterally delimited by walls 72. The deep region 71 comprises one or more conductive pads 74 (just one is shown in the figure), connected, through a conductive via 75, to the metal layer 22, and hence to the ground plane GND.

In this case, the electrically conductive connection between the cap 28 (but what has been described here applies also with reference to a cap 46 of the type of FIG. 3) and the ground plane GND is obtained through a first conductive structure 76 and a second conductive structure 78. The first conductive structure 76 is similar to the conductive structure 62 described with reference to FIGS. 5a and 5b; the second conductive structure 78 extends along a portion of the walls 72, overlapping the first conductive structure 76 so as to be in direct contact with the first conductive structure 76 and with the conductive pad 74.

The first and second conductive structures 76, 78 may be or include electrically conductive glue, of the type described previously, with reference to the embodiments of FIGS. 2a, 2b, 4a, 4b, 5a, 5b.

There is thus obtained an electrical connection between the cap 28 and the ground plane GND, through the first and second conductive structures 76, 78.

Figure 7:
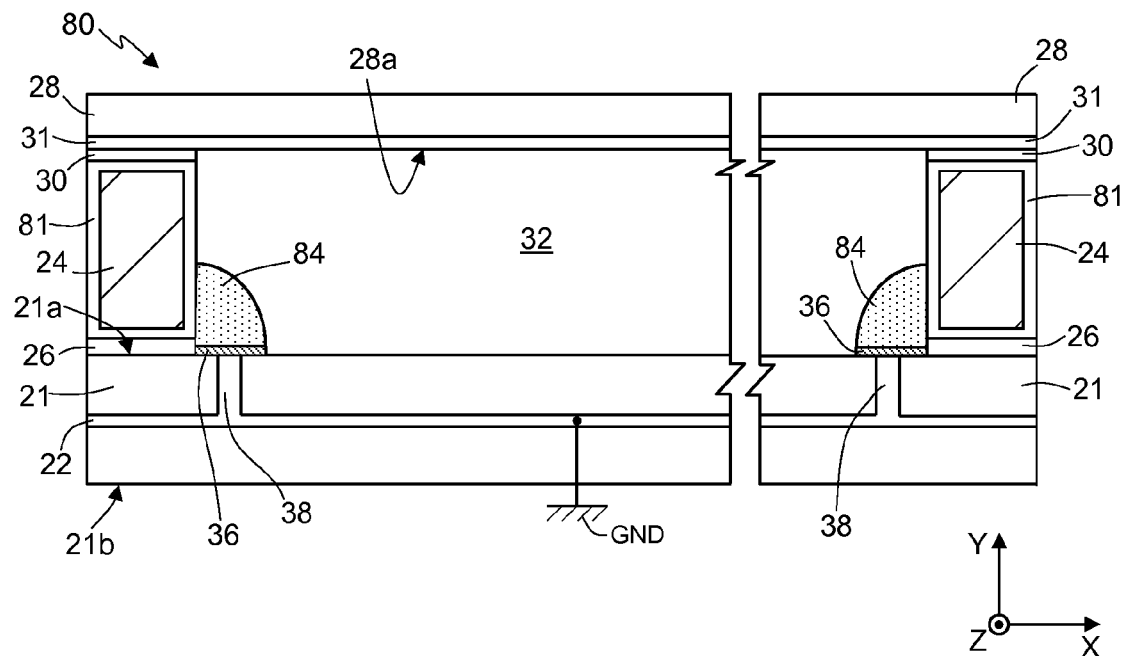
FIG. 7 shows, in cross section, an encapsulating structure according to a further embodiment of the present disclosure.

FIG. 7 shows, in lateral section, a package 80 according to a further embodiment.

Elements of the package 80 that are in common with elements of the package 20 are designated by the same reference numbers and are not described any further.

The package 80 comprises, unlike the package 20, side walls 24 coated by a conductive layer 81, for example made of conductive metal material, in particular aluminium, copper, or nickel, or gold, or a metal multilayer including copper, nickel, and gold, or the like.

In addition, the second coupling region 30 is of an electrically conductive type, obtained by means of a conductive glue, or a conductive adhesive tape, or the like.

The package 80 further comprises an electrical-connection structure 84, which extends starting from each towards the side walls 24, in direct electrical contact with the respective conductive pad 36 and with the conductive layer 81. The electrical-connection structure 84 may be or include electrically conductive glue, of the same type as the one described with reference to the previous embodiments (see, for example, what has been described with reference to FIGS. 2a and 2b). However, since the conductive layer 81 is in electrical connection with the cap 28 via the second coupling region 30, the conductive glue that forms the electrical-connection structure 84 does not necessarily have to contact directly the cap 28. It is, instead, sufficient for the electrical-connection structure 84 to be in contact with the conductive layer 81. In this way, since the conductive layer 81 is in electrical contact with the cap 28, there is formed an electrical connection between the cap 28 and the ground plane GND through the second coupling region 30, the conductive layer 81, the electrical-connection structure 84, the conductive pad 36, the conductive via 38, and the metal layer 22.

The second coupling region 30 is formed, for example, using the same conductive glue as the one used to form the electrical-connection structure 84.

It is evident that variations may be made to the embodiment described for the package 80. For example, the cap may be of the type shown in FIG. 3 and described with reference to said figure. In addition, the electrical-connection structure 84 can be of a columnar type (FIGS. 2a, 2b), or extend throughout the extension of the side walls 24 (in a way similar to what is shown in FIGS. 4a and 4b) in electrical contact with the conductive layer 81. Alternatively, the electrical-connection structure 84 extends for a limited portion of the side walls 24 (in a way similar to what is shown in FIGS. 6a and 6b). Finally, there may be present a plurality of electrical-connection structures made of conductive glue, which extend at different heights from one another, in the case where the substrate 21 presents deep regions of the type shown in FIGS. 6a and 6b. In any case, irrespective of the embodiment, the conductive glue is in electrical contact with the conductive layer 81, and a direct contact between the conductive glue and the cap is not necessary.

With reference to FIGS. 8-13 a method for manufacturing an encapsulating structure, or package, according to the present disclosure is now described.

Figure 8:
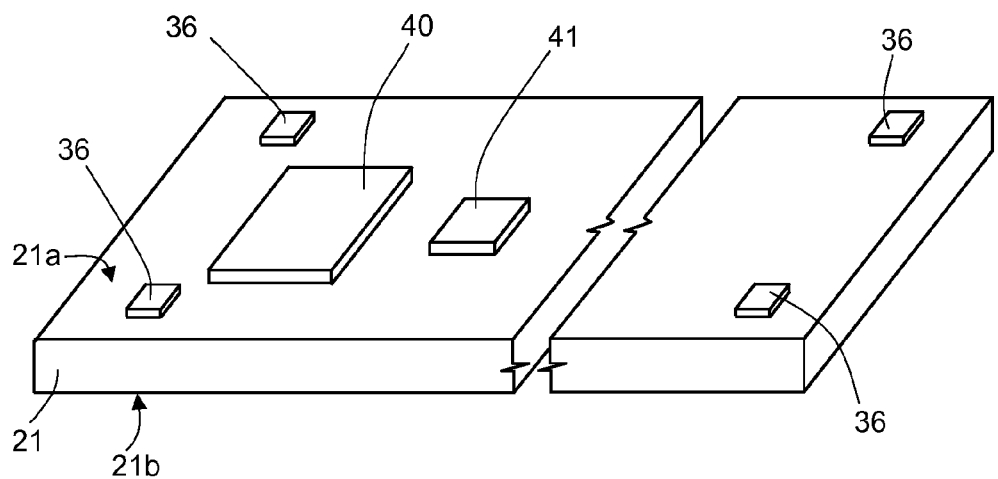
FIGS. 8, 9a, 9b, and 10-13 show, in perspective view, steps of production of the encapsulating structure according to the embodiment of FIGS. 2a and 2b.

Referring to FIG. 8, a substrate 21 is provided, for example, made of plastic or ceramic material, or FR-4 (fibreglass), or flexible material adapted to form a substrate of a flexible-printed-circuit (FPC) type. The substrate 21 is of a previously machined type, and comprises, for example, the ASIC 40 and the MEMS sensor 41, housed in a region corresponding to the surface 21a. The substrate 21 hence comprises, in a way not shown in detail, a number of layers set on top of one another made of semiconductor material, dielectric material, conductive material (in particular the metal layer 22). The substrate 21 further comprises the conductive via 38 and the conductive pads 36, formed in a known way.

Figure 1:
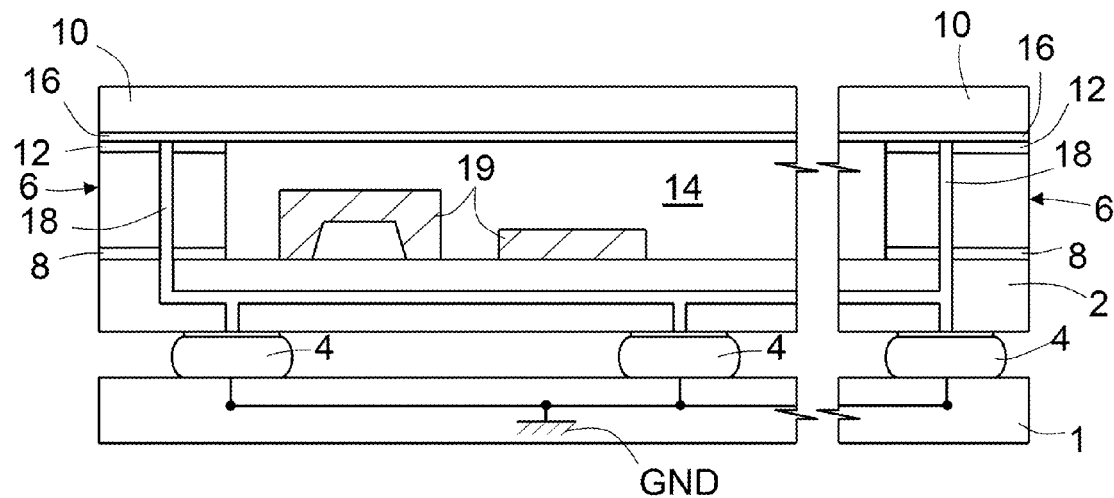
FIG. 1 shows, in cross section, an encapsulating structure (or package) of a shielded type according to an embodiment of a known type.

According to one embodiment, the substrate 21 is of a ball-grid-array (BGA) type, of a known type as shown for example in FIG. 1. In this case, conductive bumps are formed in an area corresponding to the surface 21b of the substrate 21 and connected to the metal layer 22 by means of conductive vias. Other types of substrate and/or connections may be used, for example, employing a conductive paste for coupling conductive pads together.

Figure 9A:
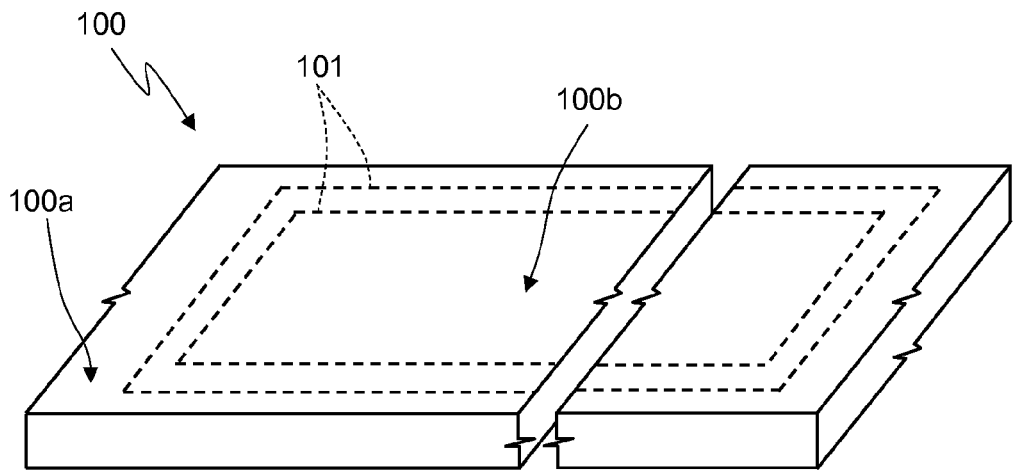
Figure 9B:
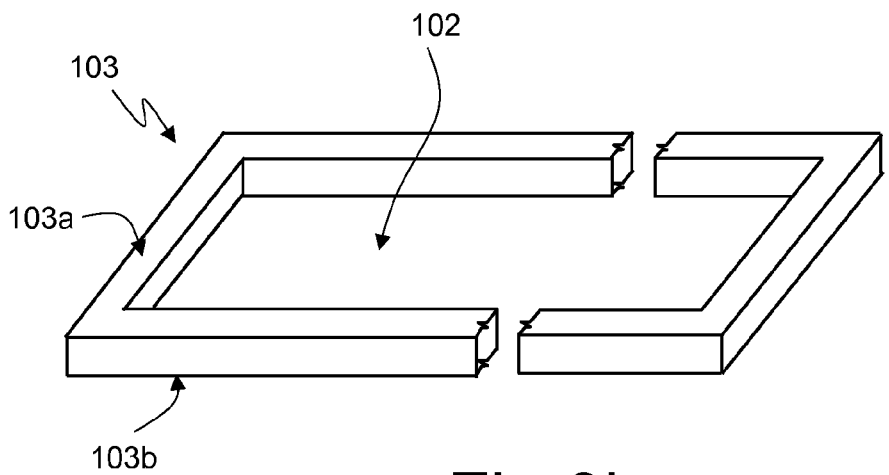

As shown in FIGS. 9a and 9b, the walls 24 are formed. The walls 24 are formed by means of a milling method, in which a cutting tip is moved on a block of solid material for removing portions of the block of solid material in order to obtain a certain desired structure. In this case, the material is BT (bismaldehyde-trizaine) resin, reinforced with fibreglass.

FIG. 9a shows a block 100, in which scribe lines 101 are shown with a dashed line. The cutting tip is moved along the scribe lines 101 to cut into the block 100 throughout its depth. The portions 100a and 100b are removed (FIG. 9b) to obtain a wall structure 103 having a quadrangular shape, which has an opening 102.

Figure 10:
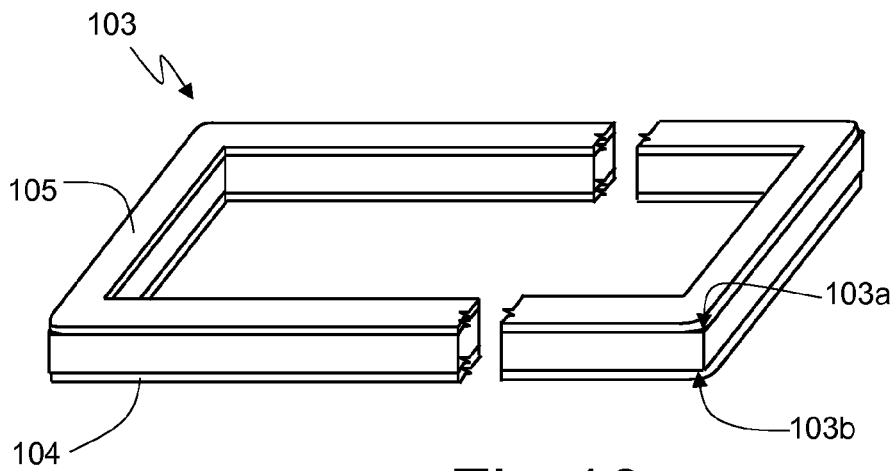

Referring to FIG. 10, a first adhesive layer 104 and a second adhesive layer 105 are formed on mutually opposite sides 103a, 103b of the wall structure 103, and in particular on the sides 103a, 103b, which are, in subsequent steps, coupled to the substrate 21 and to the cap 28. The step of forming the first and second adhesive layers 104, 105 comprises, for example, applying a layer of non-conductive glue; alternatively, it comprises applying a non-conductive biadhesive tape.

Figure 11:
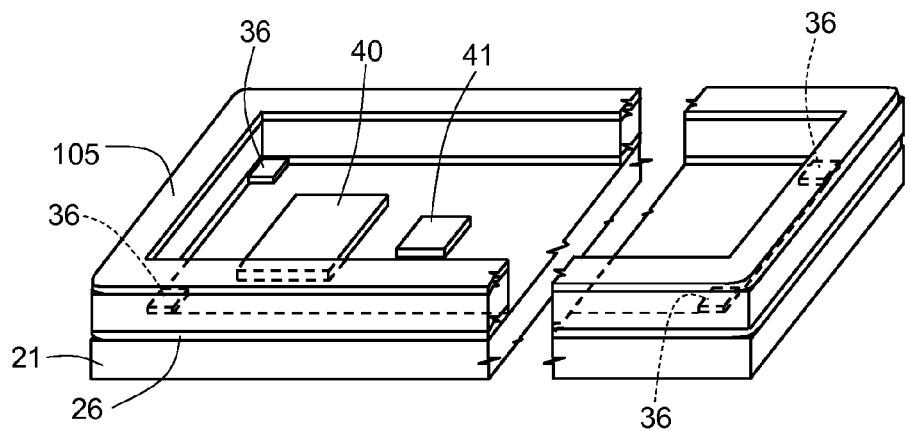

Referring to FIG. 11, the wall structure 103 is set in contact with the substrate 21 in such a way that the first adhesive layer 104 will form a coupling interface between the wall structure 103 and the surface 21a of the substrate 21. When the wall structure 103 and the surface 21a of the substrate 21 are coupled as described and shown, the first adhesive layer 104 forms the first coupling region 26 of FIG. 2a. The wall structure 103 is set so as to surround the ASIC 40, the MEMS sensor 41, and the conductive pads 36. The wall structure 103, when it is set on the substrate as described and shown, forms the side walls 24 described with reference to FIGS. 2a, 2b.

Figure 12:
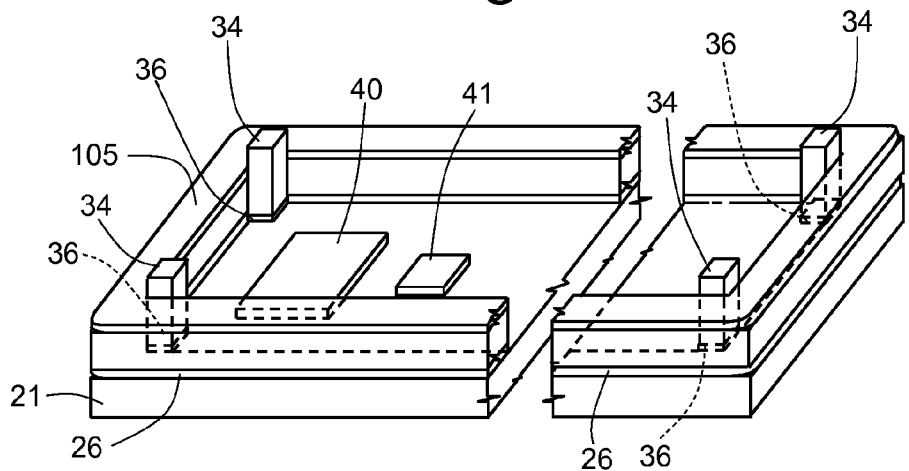

Referring to FIG. 12, the conductive columnar elements 34 for dispensing the conductive glue, of a type chosen as already described with reference to FIGS. 2a, 2b, are formed. The conductive glue is dispensed, for example, by means of jet dispensing systems of a known type and widely used in micromachining of integrated circuits and packages.

The conductive glue is dispensed in areas corresponding to the conductive pads 36, until a height, along the axis Y, is reached greater than the height k, measured along the axis Y. In this way, it is ensured that the cap 28, when set in a position above the wall structure 103, is in contact with the conductive glue. The glue can be dispensed by means of a jet dispensing machine, of a known type, adapted to dispense drops of glue having controlled size that can possibly be set according to the need.

Figure 13:
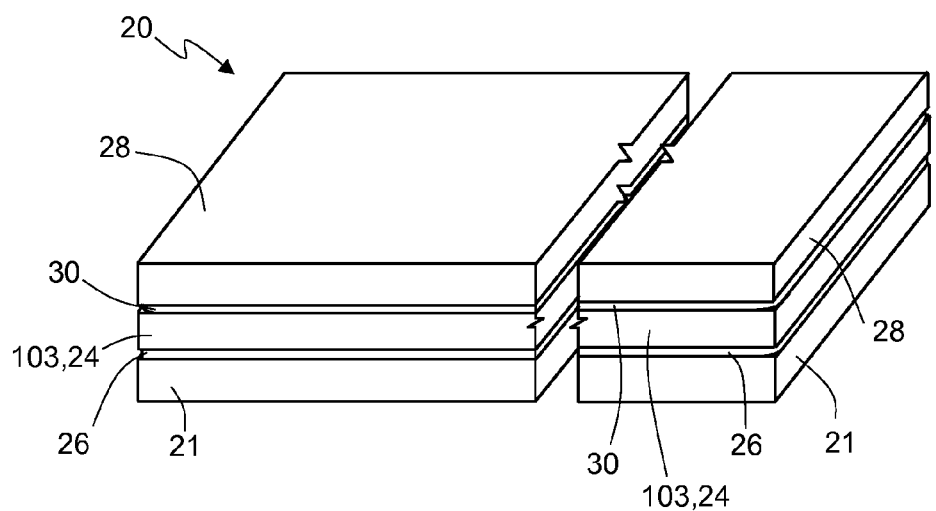

Referring to FIG. 13, the conductive cap 28 is set above of the wall structure 103 in such a way as to contact the second adhesive layer 105 that functions as coupling interface between the wall structure 103 and the cap 28.

A thermal processing step in oven, at a temperature between 150° C. and 170° C., enables polymerization of the conductive glue that forms the conductive columnar elements 34, and provides solidification and a good adhesion thereof to the cap 28 and to the conductive pads 36. The oven for the thermal-processing step is, for example, a tunnel static or dynamic oven, or a tower oven.

According to a further embodiment, the second adhesive layer 105 is made of or includes conductive glue and is formed on the wall structure 103 simultaneously with formation of the conductive columnar elements 34. In this case, the conductive glue is dispensed in regions corresponding to the conductive pads 36 and also above the wall structure 103, in such a way as to contact the side 28a of the cap 28, thus forming the second coupling region 30. In the case where the same conductive glue is used to form the columnar elements 34 and the second adhesive layer 105, the thermal-processing step causes polymerization also the second adhesive layer 105 (to form the second coupling region 30).

According to an alternative embodiment, the second coupling region 30 is formed by applying a non-conductive biadhesive tape in an area corresponding to the side 28a of the cap 28, and then the cap 28 is coupled to the wall structure 103.

The manufacturing process described with reference to FIGS. 8-13 can be applied to all the embodiments described according to the present disclosure, by simply modifying the modalities of dispensing of the conductive glue (for example, instead of forming columnar elements, it is possible to dispense the conductive glue along the entire extension of the side walls, FIG. 4a; or else along a portion of the side walls, FIG. 5b; or else on a number of levels in the case where the substrate 21 presents areas at different heights with respect to one another, FIG. 6b; or else reducing the amount of glue dispensed in order to provide electrical contacts between conductive side walls 24 and pads 36, FIG. 7).

It is to be appreciated that the one or more of the steps of the described method may be performed sequentially, in parallel, omitted, or in an order different from the order that is illustrated.

FIG. 14 shows, in cross-sectional view, a package 200 for a MEMS microphone 201, according to the present disclosure. The package 200 is formed according to any one of the embodiments described previously, and comprises regions of conductive glue forming part of an electrical connection between the cap 28 (or cap 46, with reference to the embodiment of FIG. 3) of the package 200 and conductive pads 36 formed on the substrate 21 of the package 200. Said regions of conductive glue can be columnar elements of the type shown in FIG. 2b, or strips of conductive glue of the type shown in FIGS. 4a, 5b, 6b, for creating a direct electrical contact between the cap 28 or 46 and the substrate 21. Alternatively, the regions of conductive glue are extensive columnar elements or strips adapted to create an electrical contact between side walls provided with a conductive layer and the conductive pads of the substrate 21 according to what is described with reference to FIG. 7.

The MEMS microphone 201 is formed according to known micromachining steps, for example silicon etching, in an area corresponding to the surface 21a of the substrate 21.

The internal cavity 32 is an acoustic cavity for the MEMS microphone 201. Formed in an area corresponding to the surface 21a of the substrate 21, an integrated circuit 202 is moreover present, connected to the MEMS microphone 201 by means of conductive wires 203, for operating the MEMS microphone 201.

The cap 28 or 46 further comprises one or more through vias 205 (only one of which is shown in the figure) to enable the passage of acoustic signals from the environment external to the package towards the internal cavity. The through hole 205 may be formed in a location not vertically aligned (i.e., not aligned along the axis Y) with the MEMS microphone 201 so as to protect the MEMS microphone 201 from possible entry of dust or agents that might damage the MEMS microphone 201 or vitiate operation thereof.

From an examination of the characteristics of the disclosure provided according to the present disclosure, the advantages that it affords are evident.

The package provided according to any one of the embodiments described presents numerous advantages. The package may be hermetically sealed, and can consequently be used also in situations in which it is desired to protect the sensors housed in the internal cavity 32 from moisture or liquids.

In addition, the embodiments described envisage a cap of a planar type, which is less expensive than machined caps that themselves comprise one or more cavities.

According to the present disclosure, the packages described form respective Faraday cages, adapted to eliminate or at least reduce the negative effects that electrostatic charges and magnetic fields external to the package might have on operation of the sensors and devices housed in the internal cavity.

According to the embodiment of FIGS. 2a and 2b the Faraday cage is not complete, but the internal cavity 32 is wide. According to the embodiment of FIGS. 4a and 4b the Faraday cage is complete (complete shielding), but the residual space of the internal cavity 32 is smaller than in the case of FIGS. 2a, 2b. The embodiment of FIGS. 5a and 5b is a compromise between the two conditions set forth above.

In addition, when required, the package according to all the embodiments described may provide mechanical protection of the devices housed in the internal cavity but also accessibility from outside (when the cap is provided with through vias).

In addition, the package according to the embodiments described has a low production cost, and enables containment of the overall dimensions.

In addition, the teaching according to the present disclosure can be applied also to non-standard packages, thus enabling a high flexibility of application.

Finally, it is clear that modifications and variations may be made to what has been described and illustrated herein without thereby departing from the sphere of protection of the present disclosure.

For example, the package according to all the embodiments of the present disclosure can be used to house any device or sensor, not limited to the MEMS microphone of FIG. 14. For example, the sensor can be a pressure sensor, in particular provided in MEMS technology.

As an alternative to what is shown in FIG. 14, the opening 205 can be formed in the substrate 21 and not in the cap 28, 46.

In addition, in order to improve the impermeability of the encapsulating structure according to the present disclosure, in particular in the case where the cap presents vias for access to the internal cavity, the cap can be coated with an impermeable tape.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An encapsulating structure comprising:
   a substrate having a first surface, a second surface, and a recess, the second surface being a surface of the recess and being a distance below said first surface;
   a first conductive pad that is arranged on the second surface, the conductive pad being configured to be electrically coupled to a conduction terminal;
   a cover member arranged at a distance from and facing the first surface of the substrate;
   housing walls extending between the first surface of the substrate and the cover member, wherein the first and second surfaces of the substrate, the cover member, and the housing walls define a cavity, the recess being within the cavity and the conductive pad being laterally spaced from the housing walls and inside the cavity; and
   an electrically conductive structure extending within the cavity between, and in electrical contact with the cover member and the conductive pad, and configured to electrically couple the cover member to the conduction terminal, the electrically conductive structure including a first electrically conductive region that extends within the cavity between the cover member and the first surface of the substrate, and a second electrically conductive region within the cavity extends along a sidewall of the recess, overlapping the first electrically conductive region and in direct electrical contact with the first electrically conductive region and the conductive pad.

2. The encapsulating structure according to claim 1, wherein the first and second electrically conductive regions include electrically conductive glue.

3. The encapsulating structure according to claim 1, wherein the second electrically conductive region extends in direct electrical contact with the first electrically conductive region and the conductive pad.

4. The encapsulating structure according to claim 1, wherein the electrically conductive structure is in direct electrical contact with the cover member and the conductive pad.

5. The encapsulating structure according to claim 1, further comprising:
a second conductive pad that is arranged on and extending above the first surface.

6. The encapsulating structure according to claim 1, wherein the first electrically conductive region extends along a portion of the housing walls.

7. The encapsulating structure according to claim 1, wherein:
the first conductive pad is one of a plurality of first conductive pads arranged on and extending above the second surface of the substrate in the cavity and coupled to a conduction terminal; and
the electrically conductive structure is one of a plurality of electrically conductive structures extending within the cavity between, and in electrical contact with, the cover member and the conductive pad and configured to electrically couple the cover member to the conduction terminal.

8. The encapsulating structure according to claim 1, wherein the cover member has one or more through holes that provide fluid access to the cavity.

9. The encapsulating structure according to claim 1, wherein the cavity is configured for housing at least one of an electrical device and a MEMS sensor.

10. The encapsulating structure according to claim 1, wherein said MEMS sensor is a MEMS microphone.

11. The encapsulating structure according to claim 1, wherein the first surface surrounds a perimeter of the recess.

12. An encapsulating structure comprising:
a substrate having a first surface, a second surface, and a recess, the second surface being a surface of the recess and being a distance below said first surface;
a cover member arranged at a distance from and facing the first surface of the substrate;
housing walls having top, bottom, internal, and external surfaces and extending between the first surface of the substrate and the cover member, wherein the substrate, the cover member, and the housing walls define a cavity;
a first conductive pad arranged on the second surface, the conductive pad being configured to be electrically coupled to a conduction terminal and being laterally spaced from the housing walls and inside the cavity;
an electrically conductive material within the cavity and on at least one of the internal surfaces of the housing walls and the cover member; and
an electrically conductive structure within the cavity and extending along a sidewall of the recess and electrically coupled to the housing walls and the conductive pad and configured to electrically couple the cover member to the conduction terminal, the electrically conductive material being between the electrically conductive structure and the housing wall.

13. The encapsulating structure according to claim 12, further comprising a conductive layer that coats the housing walls and is electrically coupled to the cover member.

14. The encapsulating structure according to claim 13, wherein the electrically conductive structure includes electrically conductive glue.

15. The encapsulating structure according to claim 13, wherein the electrically conductive structure extends in direct electrical contact with the conductive layer and the conductive pad.

16. The encapsulating structure according to claim 12, wherein:
the first conductive pad is one of a plurality of first conductive pads arranged on and extending above the first surface of the substrate in the cavity and coupled to a conduction terminal; and
the electrically conductive structure is one of a plurality of electrically conductive structure extending within the cavity between, and in electrical contact with, the cover member and the conductive pad and configured to electrically couple the cover member to the conduction terminal.

17. The encapsulating structure according to claim 12, wherein the cover member has one or more through holes that provide fluid access to the cavity.

18. The encapsulating structure according to claim 12, wherein the cavity is configured for housing at least one of an electrical device and a MEMS sensor.

19. The encapsulating structure according to claim 12, wherein the conductive material surrounds the housing wall.

20. The encapsulating structure according to claim 12, wherein the substrate is of a ball-grid-array type and comprises a plurality of conductive bumps adapted to be coupled to an integrated-circuit board.

21. The encapsulating structure of claim 1, wherein the first conductive pad is laterally spaced from the housing walls.

22. The encapsulating structure of claim 12, wherein the first conductive pad is laterally spaced from the housing walls.

23. An encapsulating structure comprising:
a substrate having a first surface, a second surface, and a recess, the second surface being a surface of the recess and being displaced a first distance from said first surface;
a cover member arranged at a second distance from and facing the first surface of the substrate;
housing walls having internal surfaces and extending between the first surface of the substrate and the cover member, wherein the substrate, the cover member, and the internal surfaces of the housing walls define a cavity;
a first conductive pad arranged on the second surface, the conductive pad being configured to be electrically coupled to a conduction terminal and being laterally spaced from the housing walls and inside the cavity;
an electrically conductive material within the cavity and on at least one of the internal surfaces of the housing walls and the cover member; and
an electrically conductive structure within the cavity and extending along a sidewall of the recess and configured to electrically couple the cover member to the conduction terminal, the electrically conductive material being between the electrically conductive structure and the housing wall.

24. The encapsulating structure according to claim 23, wherein the cover member has one or more through holes that provide fluid access to the cavity.

25. The encapsulating structure of claim 23, wherein the first conductive pad is laterally spaced from the housing walls.

\* \* \* \* \*